(12) United States Patent
Tamaki

(10) Patent No.: US 12,124,122 B2
(45) Date of Patent: Oct. 22, 2024

(54) DISPLAY DEVICE

(71) Applicant: KYOCERA Corporation, Kyoto (JP)

(72) Inventor: Masaya Tamaki, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 75 days.

(21) Appl. No.: 18/021,325

(22) PCT Filed: Aug. 2, 2021

(86) PCT No.: PCT/JP2021/028612
§ 371 (c)(1),
(2) Date: Feb. 14, 2023

(87) PCT Pub. No.: WO2022/039010
PCT Pub. Date: Feb. 24, 2022

(65) Prior Publication Data
US 2024/0012280 A1 Jan. 11, 2024

(30) Foreign Application Priority Data
Aug. 18, 2020 (JP) ................................ 2020-138153

(51) Int. Cl.
*G02F 1/1335* (2006.01)
*G02F 1/1334* (2006.01)
(Continued)

(52) U.S. Cl.
CPC ...... *G02F 1/133512* (2013.01); *G02F 1/1334* (2013.01); *G02F 1/1336* (2013.01); *G02F 1/133603* (2013.01); *G02F 1/133605* (2013.01); *G02F 1/13476* (2013.01); *G02F 1/136209* (2013.01); *H01L 33/60* (2013.01)

(58) Field of Classification Search
CPC ......... G02F 1/133512; G02F 1/136209; G02F 1/133603; G02F 1/13476; G02F 1/133605; H01L 33/60
See application file for complete search history.

(56) References Cited

U.S. PATENT DOCUMENTS

2009/0033596 A1* 2/2009 Yoon ..................... G02F 1/1323
 345/76
2012/0176570 A1* 7/2012 Yamazaki ............. G02F 1/1333
 349/110

FOREIGN PATENT DOCUMENTS

JP 2012-155320 A 8/2012

* cited by examiner

*Primary Examiner* — Jessica M Merlin
(74) *Attorney, Agent, or Firm* — Procopio, Cory, Hargreaves & Savitch LLP

(57) ABSTRACT

A display device includes a light emitter located on a first light-transmissive substrate, a second light-transmissive substrate facing the first light-transmissive substrate, a first light-shielding layer located on the first light-transmissive substrate and located away from the light emitter, a second light-shielding layer located on the second light-transmissive substrate and located away from a first portion facing the first light-shielding layer, a first light output section between the first light-shielding layer and the first portion and switchable between a transmissive state and a scattering state, and a second light output section between the second light-shielding layer and a second portion located on the first light-transmissive substrate and facing the second light-shielding layer. The second light output section is switchable between the transmissive state and the scattering state.

18 Claims, 5 Drawing Sheets

(51) Int. Cl.
*G02F 1/13357* (2006.01)
*G02F 1/1347* (2006.01)
*G02F 1/1362* (2006.01)
*H01L 33/60* (2010.01)

DISPLAY DEVICE

TECHNICAL FIELD

The present disclosure relates to a display device including self-luminous light emitters such as light-emitting diodes (LEDs).

BACKGROUND OF INVENTION

A known display device including self-luminous light emitters is described in, for example, Patent Literature 1.

CITATION LIST

Patent Literature

Patent Literature 1: Japanese Unexamined Patent Application Publication No. 2012-155320

SUMMARY

In an aspect of the present disclosure, a display device includes a light emitter located on a first light-transmissive substrate, a second light-transmissive substrate facing the first light-transmissive substrate with the light emitter in between, a first light-shielding layer located on the first light-transmissive substrate and located away from the light emitter, a first portion located on the second light-transmissive substrate and facing the first light-shielding layer, a second light-shielding layer located on the second light-transmissive substrate and located away from the first portion, a first light output section between the first light-shielding layer and the first portion and switchable between a transmissive state and a scattering state, a second portion located on the first light-transmissive substrate and facing the second light-shielding layer, and a second light output section between the second light-shielding layer and the second portion. The second light output section is switchable between the transmissive state and the scattering state.

BRIEF DESCRIPTION OF THE DRAWINGS

The objects, features, and advantages of the present disclosure will become more apparent from the following detailed description and the drawings.

DESCRIPTION OF EMBODIMENTS

A display device with the structure that forms the basis of a display device according to one or more embodiments of the present disclosure will now be described.

The display device that forms the basis of the display device according to one or more embodiments of the present disclosure includes, as described in Patent Literature 1, a first support being light-transmissive, a first light output section including a light emitter located on the first support, a second support being light-transmissive and facing the first support, a second light output section located on the second support, facing the first light output section, and including a liquid crystal layer being light-scattering, and a light-shield for blocking and unblocking multiple pixels. This display device has a see-through mode for allowing a display to be seen through, and a video display mode for simply displaying a video. The display device switches between the see-through mode and the video display mode to perform a front surface display, a rear surface display, or a dual-surface display.

The display device that forms the basis of the display device according to one or more embodiments of the present disclosure includes the light shield including a microelectromechanical systems (MEMS) device that is drivable in corporation with the light-scattering liquid crystal layer. The overall structure of this display device is complicated. Display devices with simpler structures that can be manufactured at low cost with high yields are awaited.

A display device according to one or more embodiments of the present disclosure will now be described with reference to the accompanying drawings.

Figure 1:
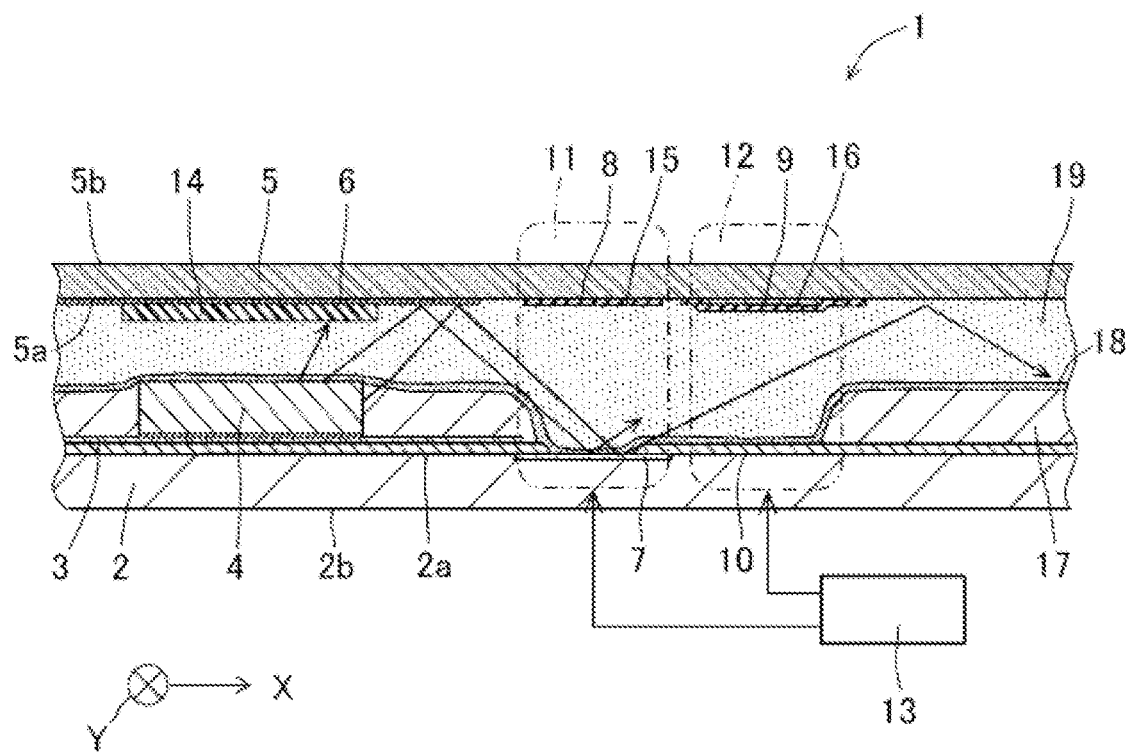
FIG. 1 is a cross-sectional view of a display device according to an embodiment of the present disclosure.

In one or more embodiments of the present disclosure, as illustrated in FIG. 1, a display device 1 includes a light emitter 4 on a first light-transmissive substrate 2, a second light-transmissive substrate 5 facing the first light-transmissive substrate 2 with the light emitter 4 in between, a first light-shielding layer 7 located on the first light-transmissive substrate 2 and located away from the light emitter 4, in short the first light-shielding layer 7 surrounds the light emitter 4 in a plan view, a second light-shielding layer 9 located on the second light-transmissive substrate 5 and located away from a first portion 8 located on the second light-transmissive substrate 5 and facing the first light-shielding layer 7, in short the second light-shielding layer 9 surrounds the first portion 8 in a plan view a first light output section 11 between the first light-shielding layer 7 and the first portion 8 to be switchable between a transmissive state to transmit emission light from the light emitter 4 (hereafter simply referred to as emission light) and a scattering state to scatter emission light and output the emission light outside, and a second light output section 12 between the second light-shielding layer 9 and a second portion 10 located on the first light-transmissive substrate 2 and facing the second light-shielding layer 9 to be switchable between the transmissive state and the scattering state.

This structure produces the effects described below. The first light output section 11 and the second light output section 12, which transmit or scatter emission light from the light emitter 4, can be located between the first light-transmissive substrate 2 and the second light-transmissive substrate 5 and adjacent to each other in a direction parallel to the surfaces of the substrates 2 and 5. This allows the display device 1 to have a thinner and simpler structure. This simple structure also allows switching between the front surface display (in a first display mode) and the rear surface display (in a second display mode), and further allows use of the dual-surface display (in a third display mode). Thus, the display device 1 can be highly functional and can be manufactured at low cost with a high yield.

The display device 1 may include a first reflective layer 3 located between the first light-transmissive substrate 2 and the light emitter 4, and a second reflective layer 6 located on the second light-transmissive substrate 5 and above the light emitter 4. The second reflective layer 6 may cover the light emitter 4. This structure can reflect emission light efficiently toward the first light output section 11 and the second light output section 12.

The structure may include one or more light emitters 4. The first reflective layer 3 on the first light-transmissive substrate 2 is located on a light emitter mount (first surface 2a) located on the first light-transmissive substrate 2. The light emitters 4 on the first reflective layer 3 may be sized to be inside the first reflective layer 3 in a plan view. In this structure, an area surrounding the light emitters 4 in the first reflective layer 3 functions as a reflective area that reflects part of emission light from the light emitters 4 toward the first light output section 11.

The second light-transmissive substrate 5 faces the first light-transmissive substrate 2 with the light emitters 4 in between. The distance (gap) between the first light-transmissive substrate 2 and the second light-transmissive substrate 5 may be about 3 to 300 μm, or about 10 to 200 μm. The distance is not limited to these values.

The second reflective layer 6 located on the second light-transmissive substrate 5 and above the light emitters 4. The second reflective layer 6 may cover the light emitters 4. The second reflective layer 6 may be located on the surface (third surface 5a) of the second light-transmissive substrate 5 facing the first light-transmissive substrate 2, or on the surface (fourth surface 5b) of the second light-transmissive substrate 5 opposite to the surface (third surface 5a) facing the first light-transmissive substrate 2.

The second reflective layer 6 may cover the first reflective layer 3. In other words, the first reflective layer 3 may be inside the second reflective layer 6 in a plan view. In this structure, the second reflective layer 6 is located farther from the light emitters 4 than the first reflective layer 3 is, and thus may not easily reflect emission light. However, the second reflective layer 6 has a larger size (area) than the first reflective layer 3 and thus easily reflects emission light toward the first light output section 11 and the second light output section 12 without escape of the light. Although the second reflective layer 6 may have a size (area) larger than and up to twice the size (area) of the first reflective layer 3, the size (area) of the second reflective layer 6 is not limited to this range.

In a plan view, the second light output section 12 may have a greater width than the first light output section 11. In this structure, scattered light from the second light output section 12, which is farther from the light emitters 4 than the first light output section 11 is, may have lower intensity than scattered light from the first light output section 11. However, the second light output section 12 has a greater volume than the first light output section 11 and thus can easily have scattered light with intensity similar to or at the same level as scattered light from the first light output section 11.

When the first light output section 11 and the second light output section 12 are square, rectangular, diamond, or in any other shape with corners in a plan view, these corners may be rounded. These light output sections can reduce changes in the light extraction efficiency at their corners, such as being darker at the corners than in other portions.

The first light output section 11 and the second light output section 12 in a plan view may be entirely curved and have no corners. For example, the first light output section 11 and the second light output section 12 may be circular or oval. These light output sections can eliminate changes in the light extraction efficiency at their corners, such as being darker at the corners than in other portions.

The first light-shielding layer 7 located on the first light-transmissive substrate 2 and surrounding the first reflective layer 3 may be located on the surface (first surface 2a) of the first light-transmissive substrate 2 facing the second light-transmissive substrate 5, or on the surface (second surface 2b) of the first light-transmissive substrate 2 opposite to the surface (first surface 2a) facing the second light-transmissive substrate 5.

The second light-shielding layer 9 located on the second light-transmissive substrate 5 and surrounding the first portion 8 facing the first light-shielding layer 7 may be located on the surface (third surface 5a) of the second light-transmissive substrate 5 facing the first light-transmissive substrate 2, or on the surface (fourth surface 5b) of the second light-transmissive substrate 5 opposite to the surface (third surface 5a) facing the first light-transmissive substrate 2.

The display device 1 may be switchable between the first display mode (front surface display mode) in which the first light output section 11 is in the scattering state and the second light output section 12 is in the transmissive state to output emission light from the light emitter 4 outside the second light-transmissive substrate 5 and the second display mode (rear surface display mode) in which the first light output section 11 is in the transmissive state and the second light output section 12 is in the scattering state to output emission light outside the first light-transmissive substrate 2. These modes can be used for the structure including a single light emitter 4. The structure including multiple light emitters 4 may further have the third display mode (dual-surface display mode).

The display device 1 may be configured to produce a display image in the first display mode differently from a display image in the second display mode. The first display mode and the second display mode may be switched in response to a switch operation or may be switched periodically in an automated manner. The display device 1 may include a motion detector to switch between the first display mode and the second display mode based on the number of people outside (adjacent to the front surface of) the second light-transmissive substrate 5 and the number of people outside (adjacent to the rear surface of) the first light-transmissive substrate 2. For example, the display device 1 may display an image on either the front surface or the rear surface around which a person is detected. The display device 1 may display an image on either the front surface or the rear surface around which more people are detected. The motion detector may be, for example, an infrared sensor or an image sensor including a semiconductor imaging device.

The display device 1 may switch between the first display mode and the second display mode alternately. In this structure, the switching frequency may be set to a typical frame frequency of about 60 to 240 Hz to allow the display device 1 to perform substantially a dual-surface display. The display device 1 may switch between the first display mode and the second display mode at least for every frame or specifically for every one to ten frames. However, the number of frames for switching is not limited to this range.

FIG. 1 is a cross-sectional view of the display device 1 according to an embodiment of the present disclosure. The display device 1 according to the present embodiment may have the structure described below. More specifically, the display device 1 includes the first light-transmissive substrate 2 including the first surface 2a and the second surface 2b opposite to the first surface 2a, the multiple light emitters 4 in a matrix located on the first surface 2a, the second light-transmissive substrate 5 including the third surface 5a facing the first surface 2a and the fourth surface 5b opposite to the third surface 5a, multiple first light-shielding layers 7 located on the first surface 2a and surrounding the multiple light emitters 4, multiple second light-shielding layers 9 located on the third surface 5a and surrounding multiple first portions 8 facing the multiple first light-shielding layers 7, multiple first light output sections 11 located between the multiple first light-shielding layers 7 and the multiple first portions 8 to be switchable between the transmissive state to transmit emission light from the multiple light emitters 4 and the scattering state to scatter emission light from the multiple light emitters 4, multiple second light output sections 12 located between the multiple second light-shielding layers 9 and multiple second portions 10 located on the first surface 2a and facing the multiple second light-shielding layers 9 to be switchable between the transmissive state and the scattering state, and a controller 13 to control states of the multiple first light output sections 11 and states of the multiple second light output sections 12.

The controller 13 may be a circuit included in a driving circuit, such as a gate signal line driving circuit and a source signal line driving circuit included in the display device 1, or may be a circuit or a circuit board separate from such a driving circuit. The controller 13 may be a driver such as an IC or an LSI included in the display device 1, or a software program stored in a read-only memory (ROM) or a random-access memory (RAM) included in a driver. The controller 13 may be a driver or a circuit board separate from the display device 1.

The display device 1 may include multiple first reflective layers 3 located between the first light-transmissive substrate 2 and the multiple light emitters 4, and multiple second reflective layers 6 located on the second light-transmissive substrate 5 and above the multiple light emitters 4. This structure can reflect emission light efficiently toward the first light output section 11 and the second light output section 12.

The display device 1 may have the structure described below. The multiple light emitters 4 include a first light emitter and a second light emitter, and the display device 1 is switchable between the first display mode in which the first light output section 11 is in the scattering state and the second light output section 12 is in the transmissive state in each of the first light emitter and the second light emitter to output emission light outside the second light-transmissive substrate 5, the second display mode in which the first light output section 11 is in the transmissive state and the second light output section 12 is in the scattering state in each of the first light emitter and the second light emitter to output emission light outside the first light-transmissive substrate 2, and the third display mode in which the first light output section 11 is in the scattering state and the second light output section 12 is in the transmissive state in one of the first light emitter or the second light emitter to output emission light outside the second light-transmissive substrate 5, and the first light output section 11 is in the transmissive state and the second light output section 12 is in the scattering state in the other of the first light emitter or the second light emitter to output emission light outside the first light-transmissive substrate 2.

This structure produces the effects described below. The display device 1 includes the multiple light emitters 4 including the first light emitter and the second light emitter. The display device 1 can thus control the first light output section 11 and the second light output section 12 included in the first light emitter independently of the first light output section 11 and the second light output section 12 included in the second light emitter. This structure allows switching between the three different display modes, or specifically, the first display mode (front surface display mode), the second display mode (rear surface display mode), and the third display mode (dual-surface display mode). The structure may further have a fourth display mode (dual-surface nondisplay mode).

The display device 1 may be configured to produce a display image in the first display mode differently from a display image in the second display mode. The display device 1 may be configured to produce a display image in the third display mode as the front surface display image and the rear surface display image in the same manner or differently. The first display mode, the second display mode, and the third display mode may be switched in response to a switch operation or may be switched periodically in an automated manner. The display device 1 may include the motion detector to display an image on the front surface or on the rear surface, or on both the front surface and the rear surface around which a person is detected. The motion detector may be, for example, an infrared sensor or an image sensor including a semiconductor imaging device.

The first light-transmissive substrate 2 and the second light-transmissive substrate 5 may be, for example, glass or ceramic substrates. The structure may include, on a glass substrate or a ceramic substrate, a transparent inorganic insulating layer of silicon oxide ($SiO_2$) or silicon nitride ($Si_3N_4$) as a transparent protective layer. The structure may include, on a glass substrate or a ceramic substrate, a transparent organic insulating layer such as an acrylic resin layer or a polycarbonate resin layer as a transparent planarization layer.

The display device 1 may include the second reflective layer 6 including a light-shielding area to block part of the emission light, and a reflective area to reflect other part of the emission light toward the first light output section 11. This structure can reduce direct output of part of the emission light outside the second light-transmissive substrate 5.

The display device 1 may also include the light-shielding area in the second reflective layer 6 located over the light emitters 4, and the reflective area surrounding the light-shielding area in the second reflective layer 6 in a plan view. For example, as illustrated in FIG. 1, a light-shielding layer 14 formed from a black matrix (black resin) is located as the light-shielding area over the light emitters 4 on the second reflective layer 6. The reflective area is an exposed portion of the second reflective layer 6 surrounding the light-shielding layer 14 in the second reflective layer 6 in a plan view.

The states of the first light output section 11 and the second light output section 12 can be controlled electrically. The first light output section 11 and the second light output section 12 may be controlled with another method, such as magnetic control or electromechanical control using a piezoelectric element. The first and second light output sections 11 and 12 that are controlled electrically may be formed from a liquid crystal. The first and second light output sections 11 and 12 that are controlled electromechanically may be MEMS devices based on MEMS technology. Such MEMS devices are obtained with microfabrication of semiconductor substrates, such as silicon substrates. For example, a MEMS device includes a piezoelectric element placed on a semiconductor substrate, electrodes for controlling the piezoelectric element, and a reflector located on the piezoelectric element, and controls the reflection direction of the reflector using a voltage input into the piezoelectric element.

As illustrated in FIG. 1, the display device 1 includes a first transparent electrode 15 on the first portion 8 located on the third surface 5a for electrical control, and a second transparent electrode 16 on the second light-shielding layer 9 on the third surface 5a for electrical control. The structure further includes an insulating layer 17 in an area on the first surface 2a outward from the second portion 10 and in an area on the first reflective layer 3 surrounding each light emitter 4 in a plan view, and includes a wiring layer 18 on the insulating layer 17. The first transparent electrode 15 and the second transparent electrode 16 may be formed from a light-transmissive conductive material. Examples of such materials include conductive oxides such as zinc oxide, indium oxide including tungsten oxide, indium zinc oxide (IZO) including tungsten oxide, indium oxide including titanium oxide, indium tin oxide (ITO) including titanium oxide, ITO, IZO, and ITO with silicon oxide. The first transparent electrode 15 and the second transparent electrode 16 may use, as light-transmissive conductive films, metal films with a thickness that allows light transmission, or specifically, for example, 5 to 30 nm. Examples of such metal films include films of Ca, Al, CaF, MgAg, and AlLi.

The structure further includes a liquid crystal layer 19 between the wiring layer 18 on the insulating layer 17 and the third surface 5a. The liquid crystal in the liquid crystal layer 19 may be a polymer-scattering liquid crystal that is controllable electrically to transmit or scatter visible light. The polymer scattering liquid crystal is a light-scattering liquid crystal and may be, for example, a polymer dispersed liquid crystal (PDLC) or a polymer network liquid crystal (PNLC). The liquid crystal layer 19 of such a liquid crystal contains liquid crystal molecules dispersed in a polymer layer defining a polymer network.

The light emitters 4 are light-emitting diodes (LEDs) that may be horizontal (flip chip) or vertical LEDs. The LEDs each include an anode electrode and a cathode electrode. Each LED has its anode electrode electrically connected to an anode electrode pad located on the first light-transmissive substrate 2, and its cathode electrode electrically connected to a cathode electrode pad located on the first light-transmissive substrate 2. A horizontal LED has an anode electrode and a cathode electrode located on its lower surface. A vertical LED has a cathode electrode made of, for example, aluminum on its lower surface and an anode electrode made of, for example, ITO on its upper surface. Thus, a vertical LED has a large light intensity distribution of lateral emission light and allows most part of emission light to be reflected from the reflective area of the second reflective layer 6.

The LEDs may be, for example, micro-LEDs. A micro-LED may be rectangular in a plan view. A micro-LED may have each side in a plan view with a length of about 1 to 100 µm inclusive, or about 3 to 10 µm inclusive.

Figure 2:
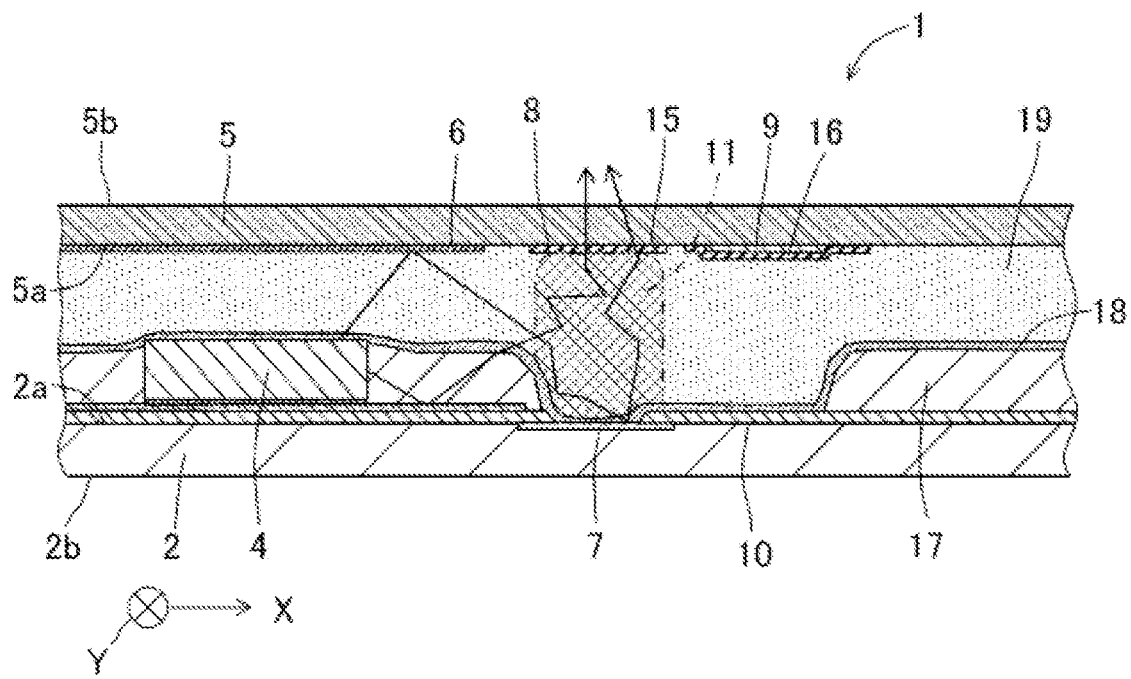
FIG. 2 is a schematic cross-sectional view of the display device with a first light output section performing a front surface display (in a first display mode).
Figure 3:
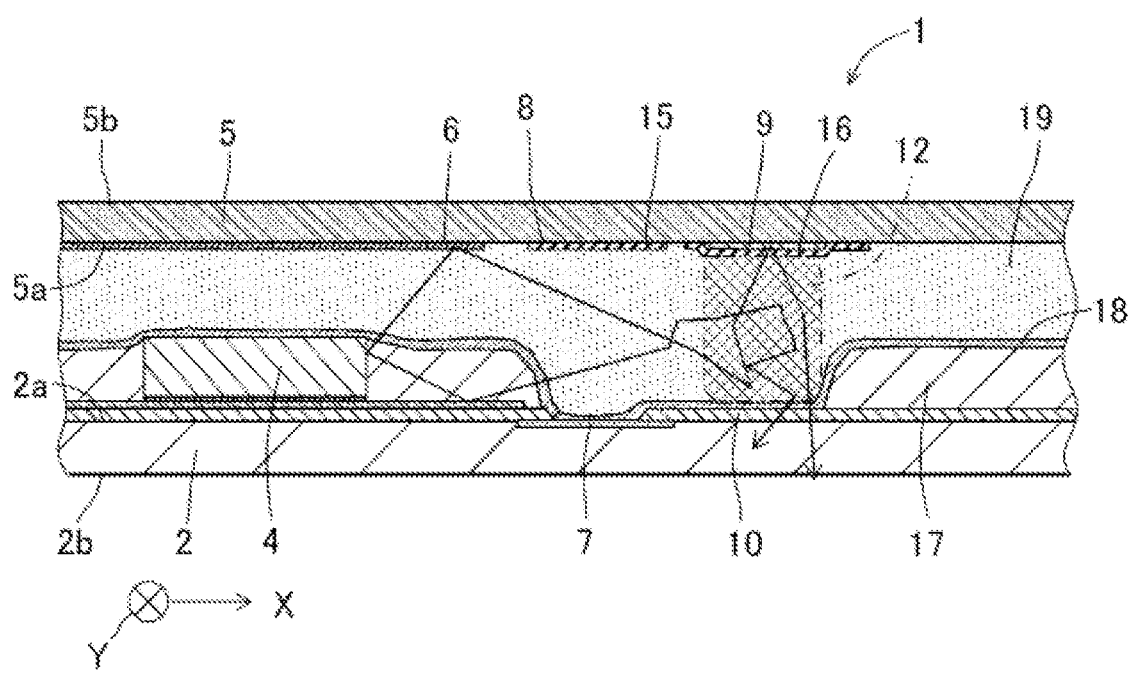
FIG. 3 is a schematic cross-sectional view of the display device with a second light output section performing a rear surface display (in a second display mode).
Figure 4:
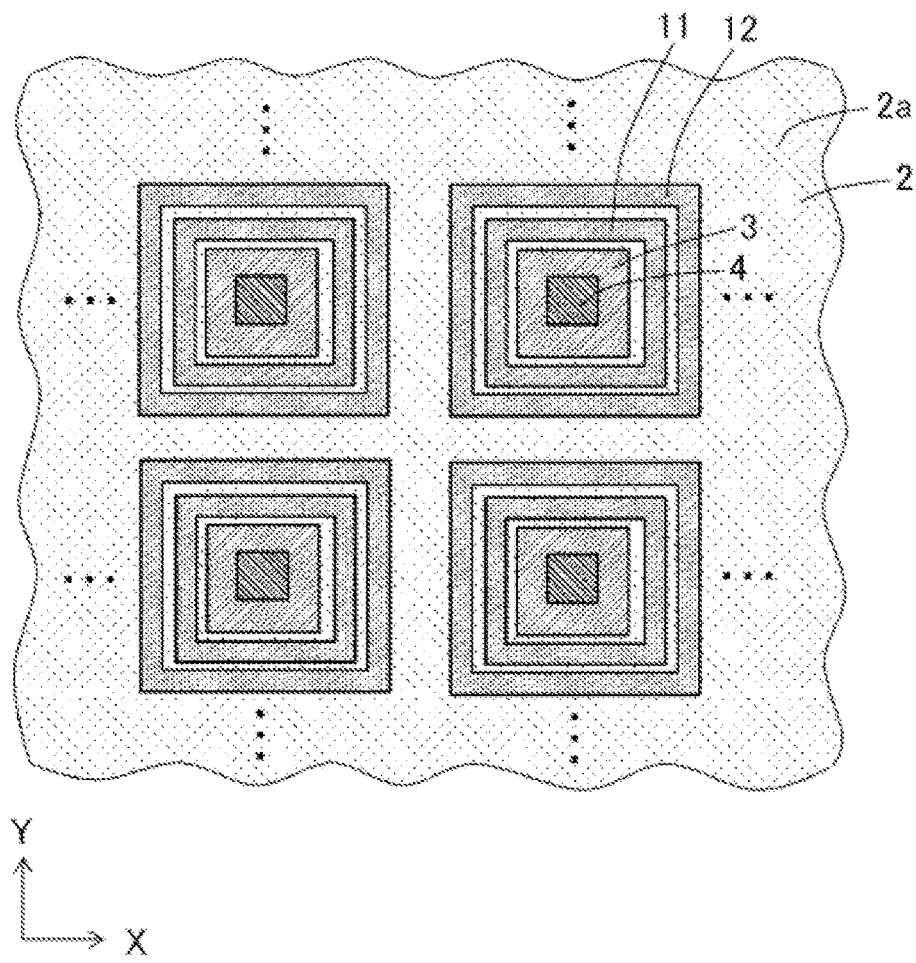
FIG. 4 is a schematic partial plan view of the display device.

FIG. 2 is a schematic cross-sectional view of the display device 1 with the first light output section 11 performing the first display mode (front surface display mode). FIG. 3 is a schematic cross-sectional view of the display device 1 with the second light output section 12 performing the second display mode (rear surface display mode). FIG. 4 is a schematic partial plan view of the display device 1. The first light output section 11 and the second light output section 12 are each in the shape of a looped quadrilateral surrounding the light emitter 4 in a plan view. The first light output section 11 and the second light output section 12 may each include a switcher, a driver, a capacitor, a gate wiring layer, and a source wiring layer. The switcher and the driver may be thin film transistors (TFTs), or for example, n-channel TFTs. Each TFT has its gate electrode connected to the gate wiring layer, its source electrode connected to the source wiring layer, and its drain electrode connected to the first transparent electrode 15 and the second transparent electrode 16. The capacitor is connected between the gate electrode and the source electrode of the TFT to hold a source-drain current for a predetermined period (period of one frame).

The TFT may be between the first light-transmissive substrate 2 and the insulating layer 17. The TFT as the driver may be located on a VDD wiring conductor or on a VSS wiring conductor. Each TFT includes a semiconductor film of, for example, amorphous silicon or low-temperature polysilicon, and includes three electrodes, or a gate electrode, a source electrode, and a drain electrode. For the structure including the first light-transmissive substrate 2 being a glass substrate and the TFT including a semiconductor film of low-temperature polysilicon, the TFT may be directly formed on the first light-transmissive substrate 2 with a thin film formation method such as chemical vapor deposition (CVD).

The display device 1 includes the switcher (first TFT) and the driver (second TFT) for driving the light emitter 4. The switcher and the driver may be in the connection described below. A source wiring layer for driving the first TFT (second source wiring layer) is connected to a source signal (data signal) terminal. The first TFT has its source electrode connected to the second source wiring layer, its gate electrode connected to a gate wiring layer for driving the first TFT (second gate wiring layer), and its drain electrode connected to a gate electrode of the second TFT. The second TFT has its source electrode connected to a VDD power supply line, and its drain electrode connected to an anode electrode of the light emitter 4. The capacitor is connected between the gate electrode and the source electrode of the second TFT to hold a source-drain current for a predetermined period (period of one frame). This structure controls the gate voltage across the second TFT by controlling the voltage between the source and the drain of the first TFT based on a data signal to control the source-drain current (drive current) of the second TFT.

The first light output section 11 includes the switcher, the driver, and the capacitor on the first surface 2a of the first light-transmissive substrate 2, and the insulating layer 17 covering the switcher, the driver, and the capacitor. The insulating layer 17 may be made of, for example, silicon oxide, silicon oxynitride, silicon nitride, silicon nitride oxide, aluminum oxide, and aluminum oxynitride. The second light output section 12 has the same or similar structure as the first light output section 11, and will not be described repeatedly.

In the display device 1 according to the present embodiment, the controller 13 drives the liquid crystal layer 19 included in the first light output section 11 in the scattering state for performing display in the first display mode as illustrated in FIG. 2. This causes emission light from the light emitters 4 to be scattered in the liquid crystal layer 19 included in the first light output section 11 and travel through the second light-transmissive substrate 5 for output toward the front surface (upper surface in FIG. 2) to display an image toward the front surface. For performing display in the second display mode, as illustrated in FIG. 3, the controller 13 controls the liquid crystal layer 19 in the first light output section 11 to be in the transmissive state and the liquid crystal layer 19 in the second light output section 12 to be in the scattering state. This causes emission light from the light emitters 4 to be transmitted through the liquid crystal layer 19 included in the first light output section 11 and be scattered in the liquid crystal layer 19 included in the second light output section 12 for output toward the rear surface (lower surface in FIG. 3) to display an image toward the rear surface.

Figure 5:
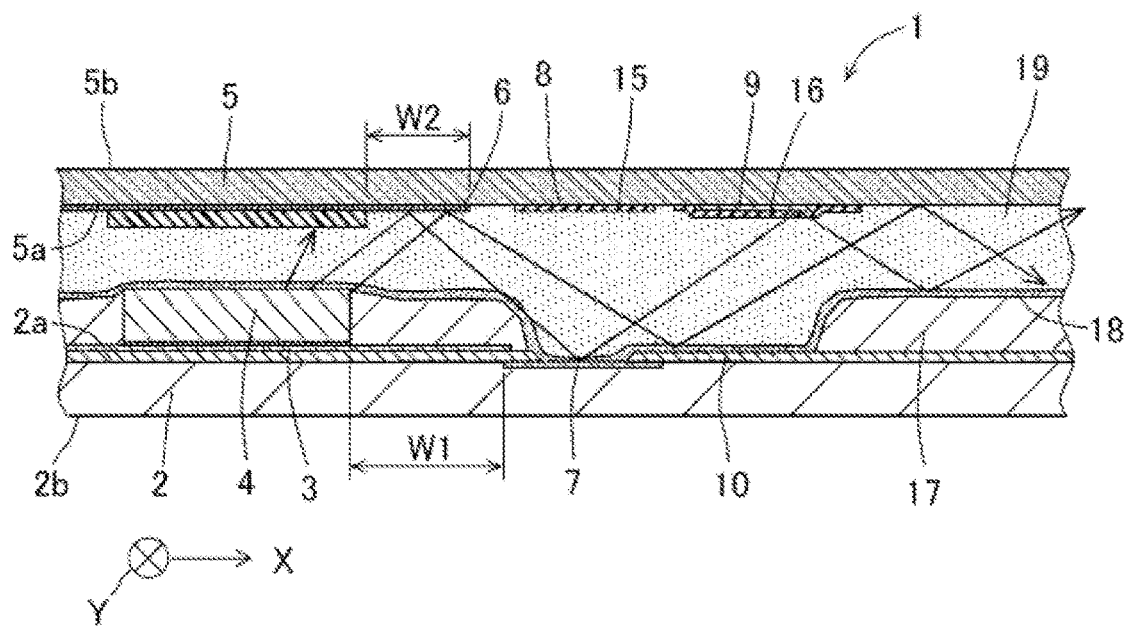
FIG. 5 is a cross-sectional view of the display device according to another embodiment illustrating an optical path for light reflected toward the first light output section with a reflective area in a second reflective layer included in the display device.
Figure 6:
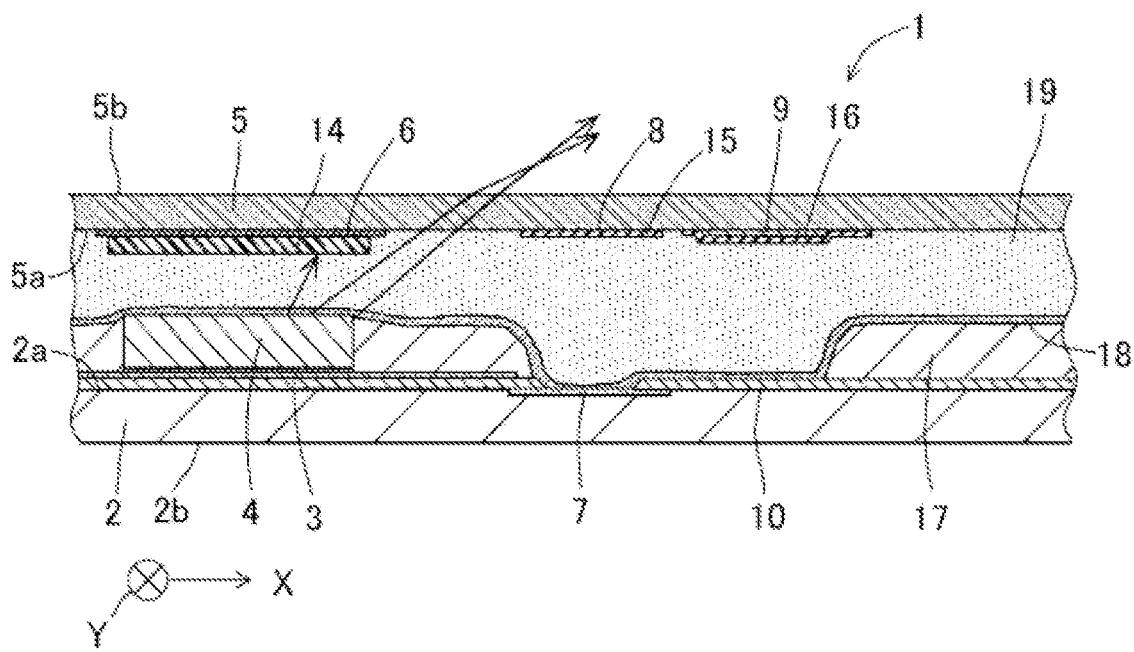
FIG. 6 is a cross-sectional view of the structure illustrated in FIG. 5 with the second reflective layer including a light-shielding area but including no reflective area.

FIG. 5 is a cross-sectional view of a display device 1 according to another embodiment with a first reflective layer 3 including a reflective area (first reflective area W1) and a second reflective layer 6 including a reflective area (second reflective area W2). FIG. 6 is a cross-sectional view of a display device 1 with a second reflective layer 6 including no second reflective area W2. In the display device 1 with the structure illustrated in each of FIGS. 5 and 6, the first reflective layer 3 includes the first reflective area W1 for reflecting emission light from the light emitters 4 toward the first light output section 11. In the display device 1 with the structure illustrated in FIG. 5, the second reflective layer 6 includes the second reflective area W2 for reflecting emission light from the light emitters 4 toward the first light output section 11. The first reflective area W1 in the first reflective layer 3 and the second reflective area W2 in the second reflective layer 6 both totally reflect emission light from the light emitters 4 to the first light output section 11 and confine the emission light between the first light-transmissive substrate 2 and the second light-transmissive substrate 5, thus avoiding a decrease in the light utilization efficiency.

Figure 7:
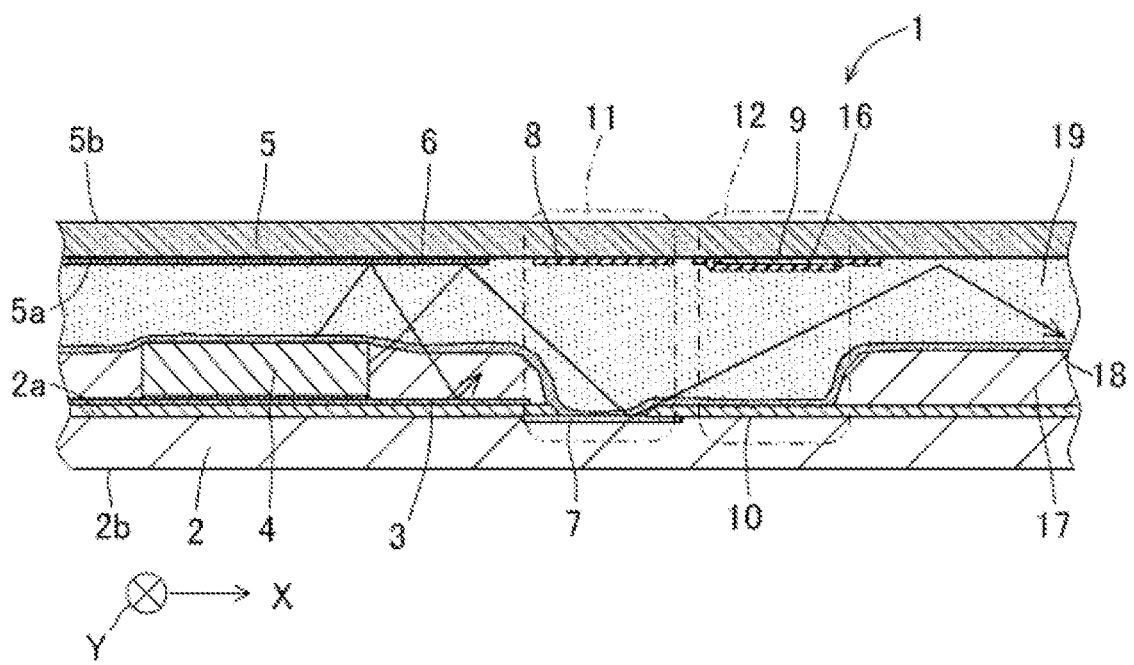
FIG. 7 is a cross-sectional view of a display device according to another embodiment of the present disclosure including a vertical LED as a light emitter.
Figure 8:
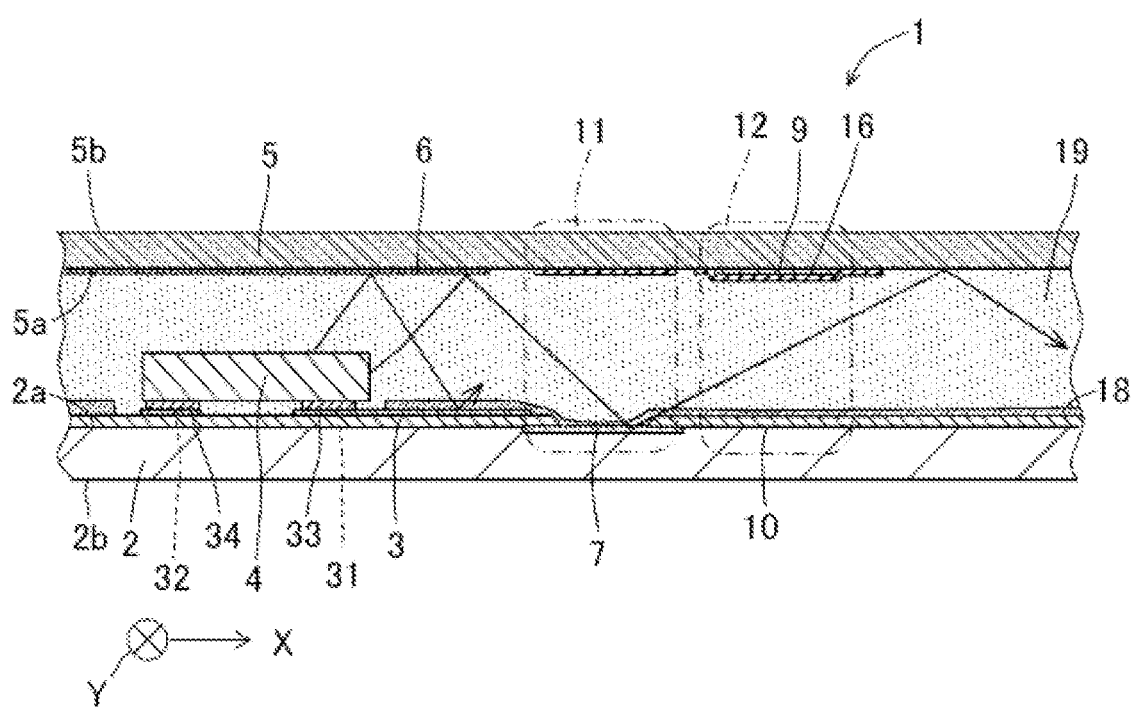
FIG. 8 is a cross-sectional view of a display device according to another embodiment of the present disclosure including a horizontal (flip chip) LED as a light emitter.

FIG. 7 is a cross-sectional view of a display device 1 according to another embodiment including a vertical LED as a light emitter 4. FIG. 8 is a cross-sectional view of a display device 1 according to another embodiment including a horizontal LED as a light emitter 4. The light emitter 4 being a vertical LED includes an anode electrode on its upper surface and a cathode electrode on its lower surface. The anode electrode may be a transparent conductive layer of, for example, ITO or IZO. The cathode electrode may be a layer of, for example, Al, Al/Ti, Ti/Al/Ti, Mo, Mo/Al/Mo, MoNd/AlNd/MoNd, Cu, Cr, Ni, or Ag. The term Al/Ti represents a stack of a Ti layer on an Al layer. The same applies to other notations.

The light emitter 4 being a horizontal LED includes an anode electrode 33 and a cathode electrode 34 on its lower surface as illustrated in FIG. 8. An anode electrode pad 31 and a cathode electrode pad 32 connected to the anode electrode 33 and the cathode electrode 34 are located on the first surface 2a. The anode electrode pad 31 and the cathode electrode pad 32 are connected to a drive circuit (not illustrated) for controlling, for example, the emission or non-emission state and the light intensity of the light emitter 4.

In one or more other embodiments of the present disclosure, each emitter may not be the LED described above, and may be, for example, a self-luminous light emitter such as an organic LED (OLED) or a laser diode (LD). In the present embodiment, each light emitter 4 is an LED, which may be a micro-LED (also pLED) in the example described above.

In the structure according to above embodiments, the controller 13 can switch the first light output section 11 and the second light output section 12 between the transmissive state and the scattering state to control the emission direction of emission light from the light emitters 4. The display device with this simplified structure can be highly functional and can be manufactured at low cost with a high yield.

In the embodiments of the present disclosure, the display device includes the first light output section and the second light output section, which transmit or scatter emission light from the light emitters, located between the first light-transmissive substrate and the second light-transmissive substrate and adjacent to each other in a direction parallel to the surfaces of the substrates. The display device can have a thinner and simpler structure. This simpler structure allows switching between the front surface display mode (first display mode) and the rear surface display mode (second display mode), and further allows use of the dual-surface display mode (third display mode). Thus, the display device 1 can be highly functional and can be manufactured at low cost with a high yield.

Although embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

INDUSTRIAL APPLICABILITY

The display device according to one or more embodiments of the present disclosure can be used in various electronic devices. Such electronic devices include composite and large display devices (multi-displays), automobile route guidance systems (car navigation systems), ship route guidance systems, aircraft route guidance systems, smartphones, mobile phones, tablets, personal digital assistants (PDAs), video cameras, digital still cameras, electronic organizers, electronic books, electronic dictionaries, personal computers, copiers, terminals for game devices, television sets, product display tags, price display tags, programmable display devices for industrial use, car audio systems, digital audio players, facsimile machines, printers, automatic teller machines (ATMs), vending machines, digital display watches, smartwatches, information displays installed at stations and airports, and signage (digital signage) for advertisement.

The present disclosure may be embodied in various forms without departing from the spirit or the main features of the present disclosure. The embodiments described above are thus merely illustrative in all respects. The scope of the present disclosure is defined not by the description given above but by the claims. Any variations and alterations contained in the claims fall within the scope of the present disclosure.

REFERENCE SIGNS

1 display device
2 first light-transmissive substrate
2a first surface
2b second surface
3 first reflective layer
4 light emitter
5 second light-transmissive substrate
5a third surface
5b fourth surface 6 second reflective layer
7 first light-shielding layer
8 first portion
9 second light-shielding layer
10 second portion
11 first light output section
12 second light output section
13 controller
14 light-shielding layer
15 first transparent electrode
16 second transparent electrode
17 insulating layer
18 wiring layer
X first direction
Y second direction

The invention claimed is:

1. A display device comprising:
a light emitter located on a first light-transmissive substrate;
a second light-transmissive substrate facing the first light-transmissive substrate with the light emitter in between;
a first light-shielding layer located on the first light-transmissive substrate and located away from the light emitter;
a first portion located on the second light-transmissive substrate and facing the first light-shielding layer;
a second light-shielding layer located on the second light-transmissive substrate and located away from the first portion;
a first light output section between the first light-shielding layer and the first portion, the first light output section being switchable between a transmissive state and a scattering state;
a second portion located on the first light-transmissive substrate and facing the second light-shielding layer; and
a second light output section between the second light-shielding layer and the second portion, the second light output section being switchable between the transmissive state and the scattering state.

2. The display device according to claim 1, further comprising:
a first reflective layer between the first light-transmissive substrate and the light emitter; and
a second reflective layer located on the second light-transmissive substrate and above the light emitter.

3. The display device according to claim 2, wherein
the light emitter is inside the first reflective layer in a plan view.

4. The display device according to claim 2, wherein
the second reflective layer is above the first reflective layer.

5. The display device according to claim 1, wherein
a width of the second light output section is greater than a width of the first light output section in a plan view.

6. The display device according to claim 1, wherein
the display device is switchable between a first display mode in which the first light output section is in the scattering state and the second light output section is in the transmissive state to output emission light outside the second light-transmissive substrate and a second display mode in which the first light output section is in the transmissive state and the second light output section is in the scattering state to output emission light outside the first light-transmissive substrate.

7. The display device according to claim 6, wherein
the display device is configured to produce a display image in the first display mode differently from a display image in the second display mode.

8. The display device according to claim 6, further comprising:
a motion detector configured to detect a person to switch between the first display mode and the second display mode based on a number of people outside the second light-transmissive substrate and a number of people outside the first light-transmissive substrate.

9. The display device according to claim 6, wherein
the display device is configured to switch between the first display mode and the second display mode alternately.

10. The display device according to claim 9, wherein
the display device is configured to switch between the first display mode and the second display mode alternately at least for every frame.

11. A display device comprising:
a first light-transmissive substrate including a first surface and a second surface opposite to the first surface;
a plurality of light emitters in a matrix located on the first surface;
a second light-transmissive substrate including a third surface facing the first surface and a fourth surface opposite to the third surface;
a plurality of first light-shielding layers located on the first surface and located in an area surrounding the plurality of light emitters;
a plurality of first portions facing the plurality of first light-shielding layers;
a plurality of second light-shielding layers located on the third surface and located in an area surrounding the plurality of first portions;
a plurality of first light output sections located between the plurality of first light-shielding layers and the plurality of first portions, the plurality of first light output sections being switchable between a transmissive state and a scattering state;
a plurality of second portions, the plurality of second portions being located on the first surface and facing the plurality of second light-shielding layers;
a plurality of second light output sections located between the plurality of second light-shielding layers and the plurality of second portions, the plurality of second light output sections being switchable between the transmissive state and the scattering state; and
a controller configured to control states of the plurality of first light output sections and states of the plurality of first light output sections.

12. The display device according to claim 11, further comprising:
a plurality of first reflective layers between the first light-transmissive substrate and the plurality of light emitters; and
a plurality of second reflective layers located on the second light-transmissive substrate and above the plurality of light emitters.

13. The display device according to claim 11, wherein
the plurality of light emitters includes a first light emitter and a second light emitter, and
the display device is switchable between a first display mode in which the first light output section is in the scattering state and the second light output section is in the transmissive state in each of the first light emitter and the second light emitter to output emission light outside the second light-transmissive substrate, a second display mode in which the first light output section is in the transmissive state and the second light output section is in the scattering state in each of the first light emitter and the second light emitter to output emission light outside the first light-transmissive substrate, and a third display mode in which the first light output section is in the scattering state and the second light output section is in the transmissive state in one of the first light emitter or the second light emitter to output emission light outside the second light-transmissive substrate, and the first light output section is in the transmissive state and the second light output section is in the scattering state in the other of the first light emitter or the second light emitter to output emission light outside the first light-transmissive substrate.

14. The display device according to claim 1, wherein a state of the first light output section and a state of the second light output section are controlled electrically.

15. The display device according to claim 14, wherein the first light output section and the second light output section each comprise a polymer-dispersed liquid crystal to be in the transmissive state or the scattering state for visible light through electrical control.

16. The display device according to claim 1, wherein the second reflective layer includes a light-shielding area to block part of emission light, and a reflective area to reflect other part of the emission light toward the first light output section.

17. The display device according to claim 16, wherein the light-shielding area in the second reflective layer is located over the light emitter, and the reflective area surrounds the light-shielding area in the second reflective layer.

18. The display device according to claim 1, wherein the light emitter includes a vertical light-emitting diode.

* * * * *